(12) United States Patent
Zergioti et al.

(10) Patent No.: US 12,421,591 B2
(45) Date of Patent: Sep. 23, 2025

(54) DUAL BEAM LASER TRANSFER

(71) Applicant: PHOSPRINT P.C., Athens (GR)

(72) Inventors: Ioanna Zergioti, Papagou (GR);
Symeon Papazoglou, Athens (GR)

(73) Assignee: PHOSPRINT P.C., Athens (GR)

( * ) Notice: Subject to any disclaimer, the term of this patent is extended or adjusted under 35 U.S.C. 154(b) by 1127 days.

(21) Appl. No.: 16/957,982

(22) PCT Filed: Dec. 28, 2017

(86) PCT No.: PCT/EP2017/084740
§ 371 (c)(1),
(2) Date: Jun. 25, 2020

(87) PCT Pub. No.: WO2019/129349
PCT Pub. Date: Jul. 4, 2019

(65) Prior Publication Data
US 2020/0324564 A1  Oct. 15, 2020

(51) Int. Cl.
*C23C 14/00* (2006.01)
*B23K 26/00* (2014.01)
(Continued)

(52) U.S. Cl.
CPC .......... *C23C 14/00* (2013.01); *B23K 26/0006* (2013.01); *B23K 26/032* (2013.01);
(Continued)

(58) Field of Classification Search
CPC .. C23C 14/00; B23K 26/0622; B23K 26/324; B23K 26/402; B23K 2103/30; B41M 5/0256
See application file for complete search history.

(56) References Cited

U.S. PATENT DOCUMENTS 5,395,729 A    3/1995  Reardon et al.
7,001,467 B2 * 2/2006  Pique .................... C23C 14/048
                                                118/726

FOREIGN PATENT DOCUMENTS

JP    H09277710 A    10/1997
JP    2001096920 A    4/2001
(Continued)

OTHER PUBLICATIONS

Papazoglou and Zergioti: "Laser Induced Forward Transfer (LIFT) of nanon-micro patterns for sensor applications," Microelectronic Engineering, 182, (2017), pp. 25-34, XP 085225383.
(Continued)

*Primary Examiner* — Hai Y Zhang
(74) *Attorney, Agent, or Firm* — NORTON ROSE FULBRIGHT US LLP

(57) ABSTRACT

Methods and devices for transferring biological or non-biological material coated on a front surface of a donor substrate to a front surface of a receiver substrate. An example of implementation: the front surface of the donor substrate is facing the front surface of the receiver substrate. The donor surface comprises a transparent portion and an absorbing layer on a front side of the transparent portion. A first laser beam of a laser irradiates a portion of a back side of the transparent portion to increase the pressure and/or temperature of the absorbing layer to eject a portion of the biological or non-biological material from the donor substrate and transfer the portion of the material to the receiver surface. The portion of the material transferred on the second substrate is post-processed by irradiating with a second laser beam of a laser a portion of the front side of the receiver surface.

14 Claims, 2 Drawing Sheets

(51) Int. Cl.

| | |
|---|---|
| *B23K 26/03* | (2006.01) |
| *B23K 26/0622* | (2014.01) |
| *B23K 26/324* | (2014.01) |
| *B23K 26/402* | (2014.01) |
| *B41M 5/025* | (2006.01) |
| *G02B 21/00* | (2006.01) |
| *G02B 21/08* | (2006.01) |
| *G02B 21/36* | (2006.01) |
| *G02B 27/28* | (2006.01) |
| *B23K 103/00* | (2006.01) |
| *H01S 3/06* | (2006.01) |
| *H01S 3/16* | (2006.01) |

(52) U.S. Cl.
CPC ........ *B23K 26/0622* (2015.10); *B23K 26/324* (2013.01); *B23K 26/402* (2013.01); *B41M 5/0256* (2013.01); *G02B 21/0088* (2013.01); *G02B 21/08* (2013.01); *G02B 21/36* (2013.01); *G02B 27/281* (2013.01); *B23K 2103/30* (2018.08); *B23K 2103/50* (2018.08); *H01S 3/0625* (2013.01); *H01S 3/1611* (2013.01); *H01S 3/1643* (2013.01)

(56) References Cited

FOREIGN PATENT DOCUMENTS

| | | |
|---|---|---|
| JP | 2005219221 A | 8/2005 |
| JP | 2014192465 A | 10/2014 |
| WO | 03101165 A1 | 12/2003 |
| WO | 2015056253 A1 | 4/2015 |

OTHER PUBLICATIONS

Chatzipetrou, et al.: Direct Creation of Biopatterns via Combination of Laser-Based Techniques and Click Chemistry. Langmuir, 33(4), (2017), pp. 848-853. XP055454610.

Mattle, et al.: "Lasewr induced forward transfer of SnO2 for sensing applications using different precursors systems", Appl. Phys. A 110 (2013), pp. 309-316.

Rodofili, et al.: "Laser-Transferred Ni-Seed for the Metallization of Silicon on Heterojunction Solar Cells by Cu-Plating", 33rd European PV Solar Energy Conf. and Exhibitition (2017), NL, pp. 1-4.

International Search Report issued in PCT/EP2017/084740 on Mar. 12, 2018.

\* cited by examiner

DUAL BEAM LASER TRANSFER

CROSS REFERENCE TO RELATED APPLICATIONS

This patent application is a national phase under 35 U.S.C. § 371 of International Patent Application No. PCT/EP2017/084740 filed Dec. 28, 2017, which is hereby incorporated herein by reference in its entirety for all purposes.

The present disclosure relates to methods and devices for use in laser transfer processes. More specifically, it relates to laser transfer processes in solid or liquid phase using a dual beam configuration.

BACKGROUND

Direct write laser techniques are used for the deposition and the processing of a material onto specific areas of a substrate. With the term "direct write" a group of techniques dealing with the direct creation of a specific pattern on a substrate without the need of pre-fabricated masks may be described. Direct write techniques offer the advantage of micron and sub-micron resolution that are important in microelectronics and bioelectronics applications and may be controlled using Computer Aided Design (CAD) programs to digitally transfer a pattern or a design to the printed material.

Among the most common direct write techniques ink-jet printing, Laser Chemical Vapor Deposition (LPCVD) and Micropen© are used, however these techniques suffer from inherent limitations with respect to the viscoelastic properties of the material under transfer limiting their resolution and printing capabilities. The direct write technique known as Laser Induced Forward Transfer (LIFT) is a technique that is usually employed for the transfer of a wide variety of materials ranging from organic substances to metallic nanoparticles inks, semiconductors, oxides and biomaterials. The technique was first reported back in 1986 from the group of Bohandy et al. (J. Bohandy, B. Kim, and F. J. Adrian, *J. Appl. Phys.*, 60, 1538 (1986)) for the transfer of copper pixels on silica substrates. The first report on the laser transfer of biomaterials using LIFT dates back to 2002, where Ringeisen et al. (B. R. Ringeisen, D. B. Chrisey, A. Pique, H. D. Young, R. Modi, M. Bucaro, J. Jones-Meehan, and B. J. Spargo, *Biomat.* 23, 161-166 (2002)) demonstrated the printing of active proteins, viable *Escherichia Coli* and mammalian Chinese hamster ovary cells using a laser direct-write technique that combined the LIFT and MAPLE techniques. Moreover, Karaiskou et al. (A. Karaiskou, I. Zergioti, C. Fotakis, M. Kapsetaki, and D Kafetzopoulos, *Appl. Surf. Sci.* 208-209, 245-249 (2003)), reported the transfer of lambda phage DNA microarrays on glass substrates using LIFT. LIFT has been also used, in point-of-care medical diagnostics as reported by Katis et al. (I. N. Katis et al., *Biomicrofl.* 8, 036502 (2014)), where antibodies were laser transferred on cellulose paper substrates.

A method and variation of LIFT has been described in U.S. Pat. No. 7,001,467 B2 to Pique. However, in U.S. Pat. No. 7,001,467 B2 to Pique, the invention is only related to materials that do not need any further processing after the transfer. In WO2017103007 (Zergioti et al.), the invention relates to transferring and activating molecular click reagents onto substrates.

SUMMARY

The present invention relates to a method which combines the selective laser transfer of biological and non-biological materials on a substrate and the subsequent laser post-processing of the transferred material with the use of a dual beam laser transfer apparatus. More specifically, the laser transferred and post-processed patterns may be:

Biological materials—that is modified or unmodified with selected terminal groups—including DNA, aptamers, antibodies, peptides, proteins, cells etc. as well as, Non-biological materials including plastics, inorganic materials, salts, oxides, graphene oxide, graphene, transition metal dichalcogenides.

In a first aspect, a method is disclosed of transferring a biological or non-biological material coated on a front surface of a donor substrate to a front surface of a receiver substrate, the front surface of the donor substrate facing the front surface of the receiver substrate, the donor substrate comprising a transparent portion and an absorbing layer on a front side of the transparent portion. The method comprises irradiating with a first laser beam of a laser a portion of a back side of the transparent portion to increase the pressure and/or temperature of the absorbing layer to eject a portion of the biological or non-biological material from the donor substrate and transfer the portion of the biological or non-biological material to the receiver surface; and post-processing the portion of the biological or non-biological material transferred on the receiver substrate by irradiating with a second laser beam of a laser a portion of the front side of the receiver surface.

The laser transfer method involves two substrates namely a donor substrate and a receiver substrate that are brought in close proximity or in contact with each other. The donor substrate is coated with the material under investigation and as the first laser beam irradiates the backside of the donor substrate a selected part or pattern of the material is propelled towards the receiver substrate. This propulsion manifests through the formation of an elongated liquid jet that travels towards the receiver substrate in the case of liquid phase transfer or as a solid flyer in the case of solid phase transfer. The donor substrate comprises a transparent material to the selected laser wavelength and an absorbing thin layer. The laser beam is absorbed by the absorbing layer, therefore leading to a temperature and pressure increase which leads to the ejection of the materials.

Depending on the transferred material (biological or non-biological) a different laser post-processing may be required. Examples of such laser post-processing may include functionalization for biological material and photo-polymerization for polymers or monomers.

Functionalization involves the binding of the selected biological materials on a selected part or all the area of a substrate. In this method the dual beam laser transfer process is used to achieve a high binding yield. For example, the mechanism for the functionalization in the proposed method in the case of thiol modified biomolecules on epoxy modified glass is that the laser beam that is employed for the functionalization induces the development of the covalent bond between C (from the epoxy C—O—C group of the substrate) and the S (from the thiol SH group of the biomolecule). In the case of amino modified DNA on epoxy modified glass again the laser beam induces the covalent bond between the carbon (from the epoxy substrate) and the N (from the amino group of the biomolecule). In the case of unmodified biomaterials on unmodified substrates the functionalization takes place owing to the increased transfer velocities and pressures that are generated during the transfer, therefore favoring the direct attachment of the material on the substrate.

Photo-polymerization may include photo-polymerization of e.g. laser printed polymers or monomers on a selected area of the receiver substrate. Depending on the polymer under investigation, different wavelengths may be used to enable rapid and site-selective laser photo-polymerization.

The wavelength of both laser beams may be between 100 and 1550 nm, for example any of the following: 193, 266, 355, 532 and 1064 nm depending on the optical absorption of the absorbing layer towards the respective wavelength. The resolution of the transferred patterns on the receiver substrate may be of the order of 1 μm up to several hundreds of microns. The laser fluence employed for the first laser beam that is used for the transfer may be between 50-500 mJ/cm$^2$, while for the second laser beam that is used for the post processing of the substrate the laser fluence may be between 30-150 mJ/cm$^2$. The laser fluence difference between the transfer and the post-processing may be attributed to the different laser energy that is required to generate each phenomenon. More specifically, the laser energy for the post processing is usually lower than that of the transfer since the transferred biological material or non-biological material is directly irradiated from the second laser beam and the portion of the laser energy that is required to induce the functionalization or activation should be low so as not to induce any damages to the biological or the non-biological material.

The receiver substrate may be an unmodified substrate or a modified one. The term unmodified includes glass, plastic, ceramic and silicon substrates where no linkers may be present, while the term modified includes any chemical, plasma, laser irradiation modification process performed on the aforementioned substrates. This modification may therefore be any process that generates chemical species and chemical bonds on the substrate surface, i.e. thiol groups, amino groups, hydroxyl, epoxy, etc.

In some examples the method may further comprise removing the donor substrate after the portion of the biological or non-biological material has been transferred. This allows for irradiation of the receiver substrate with the same laser source, albeit with a different laser beam, as only the donor substrate is removed before the post-processing. Thus the whole process may be accelerated.

In some examples the method may further comprise focusing the first laser beam on the donor surface to select the portion of the biological or non-biological material to eject from the donor substrate. By repeating the irradiation at different spots of the donor substrate it is possible to generate a pattern of biological or non-biological material on the receiver substrate.

In another aspect, a dual beam transfer configuration is disclosed. The dual beam transfer configuration may comprise a donor substrate, having a transparent portion and an absorbing layer on a front surface of the transparent portion coated with a biological or non-biological material. The dual beam transfer configuration may further comprise a receiver substrate, having a front surface facing the front surface of the donor substrate. The dual beam transfer configuration may further comprise a pulsed laser source. The pulsed laser source may be configured to irradiate with a first laser beam a back side of the donor substrate during a transferring mode of operation and to irradiate a front side of the receiver substrate during a post-processing mode of operation.

In some examples, the dual beam transfer configuration may further comprise a first stage to hold the donor substrate and a second stage to hold the receiver substrate. The stages may be independently and relatively moveable with respect to the laser beam.

In some examples, the dual beam transfer configuration may further comprise a computer controller to control the stages and the pulsed laser source. The computer controller may comprise circuitry, such as a processor and memory storage and may receive the stages positions and/or a desired pattern configuration and control the displacement of the stages and the laser beam pulses accordingly to synchronize the pulsed laser source with the stages.

In some examples the dual beam transfer configuration may further comprise an image capturing apparatus, e.g. a CCD camera, to monitor irradiation, transferring and post-processing.

In another aspect, a computer program product is disclosed. The computer program product may comprise program instructions for causing a computing system to perform a method of transferring a biological or non-biological material coated on a front surface of donor substrate to a front surface of a receiver substrate according to some examples disclosed herein.

The computer program product may be embodied on a storage medium (for example, a CD-ROM, a DVD, a USB drive, on a computer memory or on a read-only memory) or carried on a carrier signal (for example, on an electrical or optical carrier signal).

The computer program may be in the form of source code, object code, a code intermediate source and object code such as in partially compiled form, or in any other form suitable for use in the implementation of the processes. The carrier may be any entity or device capable of carrying the computer program.

For example, the carrier may comprise a storage medium, such as a ROM, for example a CD ROM or a semiconductor ROM, or a magnetic recording medium, for example a hard disk. Further, the carrier may be a transmissible carrier such as an electrical or optical signal, which may be conveyed via electrical or optical cable or by radio or other means.

When the computer program is embodied in a signal that may be conveyed directly by a cable or other device or means, the carrier may be constituted by such cable or other device or means.

Alternatively, the carrier may be an integrated circuit in which the computer program is embedded, the integrated circuit being adapted for performing, or for use in the performance of, the relevant methods.

BRIEF DESCRIPTION OF THE DRAWINGS

Non-limiting examples of the present disclosure will be described in the following, with reference to the appended drawings, in which.

DETAILED DESCRIPTION OF EXAMPLES

Figure 1:
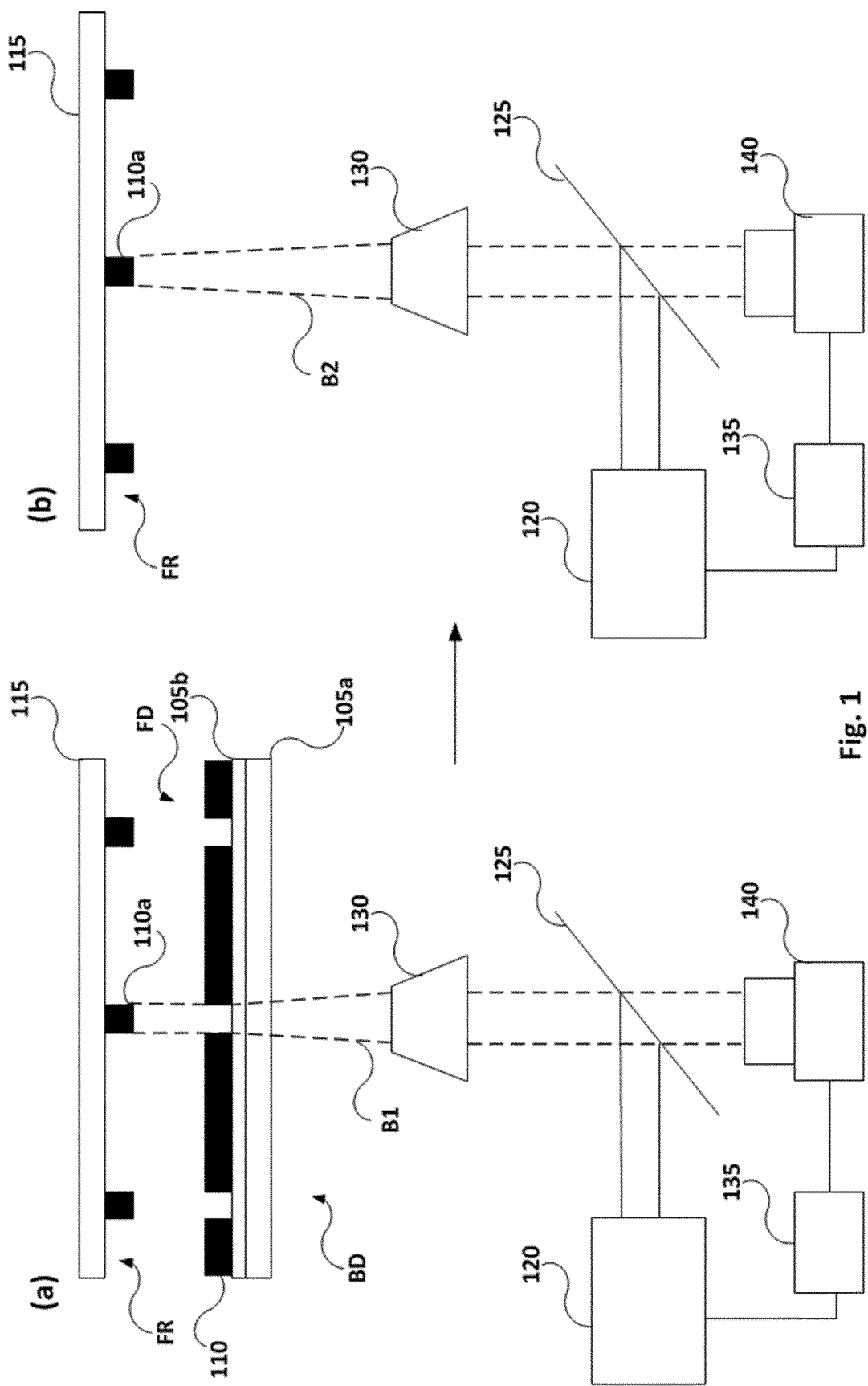
FIG. 1 schematically illustrates a dual beam transfer configuration, according to an example.

FIG. 1 schematically illustrates a dual beam transfer configuration, according to an example. During a transfer mode of operation (a) a donor substrate 105 is coated on a front surface FD with a biological or non-biological material 110. The front surface FD of the donor substrate 105 is placed facing the front surface FR of the receiver substrate 115. The donor substrate 105 comprises a transparent portion 105a and an absorbing layer 105b on a front side of the transparent portion. A laser source 120 produces a first laser beam B1 that is reflected by mirror 125 and then focused by focusing element 130. The first laser beam B1 of laser source 120 irradiates a portion of a back side BD of the transparent portion to increase the pressure and/or temperature of the absorbing layer to eject a portion 110a of the biological or non-biological material from the donor substrate 105 and to transfer the portion 110a of the biological or non-biological material to the receiver substrate 115.

During a post-processing mode of operation (b) the donor substrate 105 is removed and the portion 110a of the biological or non-biological material transferred on the second substrate 115 is processed by irradiating with a second laser beam B2 of the laser.

Figure 2:
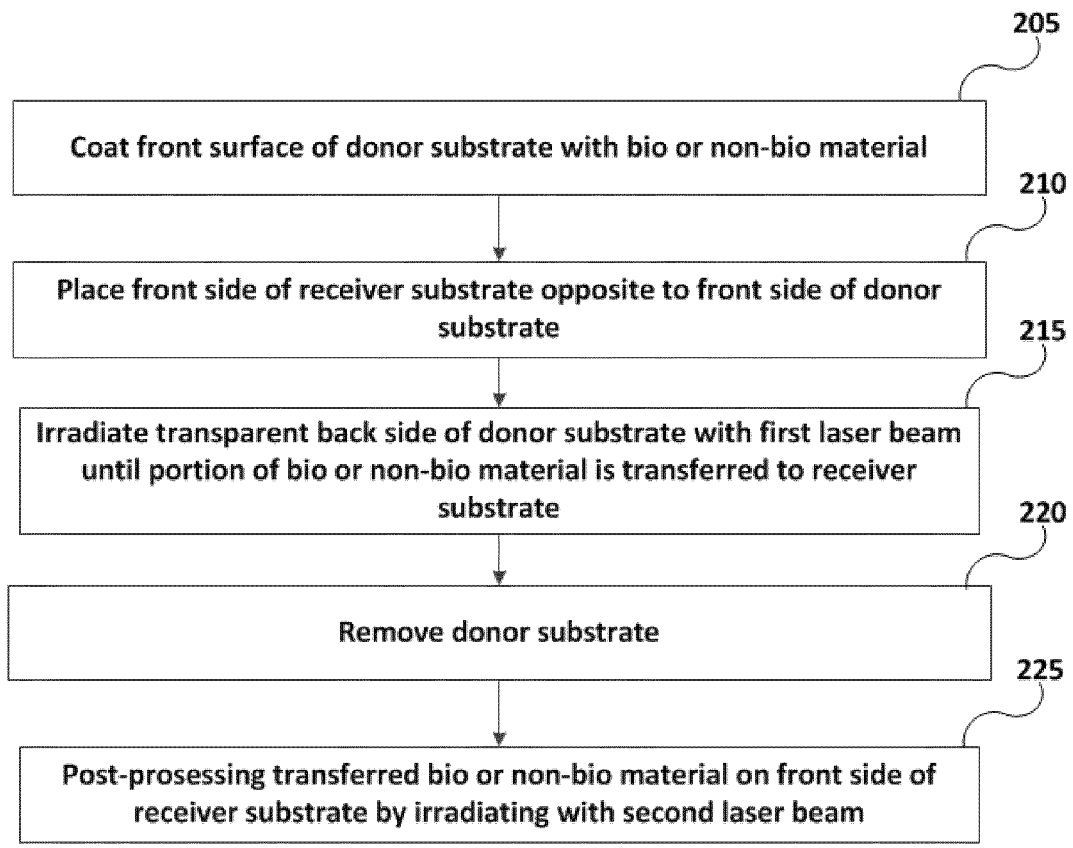
FIG. 2 schematically illustrates a method of transferring a biological or non-biological material, according to an example.

FIG. 2 schematically illustrates a method of transferring a biological or non-biological material, according to an example. In block 205, a front side of a donor substrate is coated with biological or non-biological material. In block 210, a front side of a receiver substrate is placed opposite to a front side of the donor substrate. In block 215, a transparent back side of the donor substrate is irradiated with a first laser beam from a laser source until a portion of the biological or non-biological material is transferred to the receiver surface. In block 220, the donor substrate is removed and then, in block 225, the transferred biological or non-biological material on the front side of the receiver surface is post-processed by irradiating with a second laser beam of the laser source. The characteristics of the second laser beam may be different from the characteristics of the first laser beam.

One example of the present invention relates to the transfer of a monomer on a glass substrate using the first laser beam of the dual beam laser setup and the photopolymerization of the transferred monomer with the second laser beam.

The donor substrate has been prepared by dissolving acrylic acid ($CH_2$=CHCOOH) in water, where 20 μl of the solution have been applied on a circular quartz substrate (donor substrate, 25.4 mm diameter, 1 mm thickness) using the blade-coating technique to produce a uniform thin liquid film.

The apparatus employed is the dual beam laser transfer setup where for the transfer a pulsed Nd:YAG laser source operating at 355 nm was used with a pulse duration of 8 ns. This laser wavelength was selected since a thin Ti coating was applied on the circular quartz substrate as an absorbing layer to absorb the laser energy and induce the propulsion of the material towards the receiver substrate. The laser beam was focused using a microscope objective (15× magnification) on the donor substrate and the laser spot size could be varied between 1-300 μm. The system operated at mask projection conditions and the process could be viewed in real time using a high power imaging system based on the inverted microscope principle with the aid of a CCD camera. The energy density of the laser may be adjusted using a rotating waveplate and a polarizer between 50-250 mJ/cm$^2$.

The monomer in solution-coated donor substrate was placed in close proximity to the receiving glass substrate, with the coated side facing the glass substrate. The laser beam was projected onto the donor substrate and the laser fluence was set at 80 mJ/cm$^2$, while the laser spot shape was rectangular with a diameter of 5 μm. The transfer process resulted in the deposition of rectangular acrylic acid in water pixels of approximately 5 μm diameter and 20 nm thickness on selected areas of the glass substrate and the process was performed multiple times to produce an array of 10×10 pixels using a single laser pulse for each spot. In this example of the present invention, the donor and the receiver substrates were placed on micrometer-precision computer-controlled stages and were synchronized with the laser source.

For the photopolymerization of the transferred material the donor substrate was removed and a single laser pulse was used to irradiate each transferred pixel. The laser source employed for the photopolymerization was a pulsed Nd:YAG laser source operating at 355 nm with a pulse duration of 8 ns. The laser spot on the glass substrate was adjusted at 10 μm and each pulse irradiated the entire surface of each previously transferred pixel. The laser fluence was adjusted at 130 mJ/cm$^2$ and each pixel received one laser pulse. The process was monitored using the high power imaging system described above.

Another example of the present invention includes the transfer and functionalization of unmodified DNA on specific areas of an epoxy modified glass substrate. The produced substrate is used to develop DNA assays for patient stratification.

The donor substrate has been prepared by dissolving unmodified DNA in phosphate buffer (pH 7.3) to produce a 10 μM solution, where 6 μl of the solution have been applied on a circular quartz substrate (donor substrate, 25.4 mm diameter, 1 mm thickness) using the blade-coating technique to produce a uniform thin film.

The apparatus employed for the transfer and the functionalization of the substrate included a pulsed Nd:YAG laser source operating at 355 nm with a pulse duration of 8 ns. This laser wavelength was selected since a thin Ti coating was applied on the circular quartz substrate as an absorbing layer to absorb the laser energy and induce the propulsion of the biomaterial towards the receiver substrate. The laser beam was focused using a microscope objective (15× magnification) on the donor substrate and the laser spot size could be varied between 1-300 μm. The system operated at mask projection conditions and the process could be viewed in real time using a high power imaging system based on the inverted microscope principle with the aid of a CCD camera. The energy density of the laser may be adjusted using a rotating waveplate and a polarizer between 50-500 mJ/cm$^2$.

The unmodified DNA-coated quartz substrate (donor substrate) was placed in close proximity to the receiving epoxy modified glass substrate, with the coated side facing the glass substrate. The laser beam was projected onto the donor substrate and the laser fluence was set at 250 mJ/cm$^2$, while the laser spot shape was circular with a diameter of 5 μm. The transfer process resulted in the deposition of circular DNA spots of approximately 10 μm diameter and 20 nm thickness on selected areas of the glass substrate and the process was performed multiple times to produce an array of 100×100 DNA spots using a single laser pulse for each spot. In this example of the present invention, the donor and the receiver substrates were placed on micrometer-precision computer-controlled stages and were synchronized with the laser source.

For the functionalization of the laser transferred unmodified DNA on the epoxy modified glass substrate, the donor substrate (circular quartz) was removed and a single laser pulse was employed for each DNA spot. The laser source employed for the functionalization was a pulsed Nd:YAG laser source operating at 355 nm with a pulse duration of 8 ns. The laser spot on the receiver substrate was adjusted at 15 μm and each pulse irradiated the entire surface of each DNA spot. The laser fluence was adjusted at 50 mJ/cm$^2$ and each DNA spot received one laser pulse. The process was repeated multiple times to functionalize selected areas of the glass substrate, where the biological material has been previously transferred onto. The process was monitored using the high power imaging system described above.

Another example of the present invention includes the transfer of Cy5-conjugated donkey anti-rabbit (DAR-Cy5) antibodies on specific areas of a silicon nitride ($Si_3N_4$) substrate. The produced substrate is used to develop enzyme-linked immunosorbent assay (ELISA) assays.

The donor substrate has been prepared by dissolving a stock antibody solution (5 mg/ml) in phosphate buffer saline (pH 7.0) and performing a 1:50 dilution to produce a 0.1 mg/ml solution, were 10 µl of the solution have been drop casted on a circular quartz substrate (donor substrate, 25.4 mm diameter, 1 mm thickness) and left to dry overnight to produce a uniform thin film (solid-phase transfer).

The apparatus employed for the transfer included a pulsed Nd:YAG laser source operating at 355 nm with a pulse duration of 8 ns. This laser wavelength was selected since a thin Ti coating was applied on the circular quartz substrate as an absorbing layer to absorb the laser energy and induce the propulsion of the biomaterial towards the receiver substrate. The laser beam was focused using a plano-convex lens (50 mm focal length) on the donor substrate and the laser spot size could be varied between 1-300 µm. The system operated at mask projection conditions and the process could be viewed in real time using a high power imaging system based on the inverted microscope principle with the aid of a CCD camera. The energy density of the laser may be adjusted using a rotating waveplate and a polarizer between 100-400 mJ/cm$^2$.

The antibody-coated quartz substrate (donor substrate) was placed in close proximity (10-3000 µm) to the receiving silicon nitride substrate, with the coated side facing the silicon nitride substrate. The laser beam was projected onto the donor substrate and the laser fluence was set at 200 mJ/cm$^2$, while the laser spot shape was rectangular with a diameter of 30 µm. The transfer process resulted in the deposition of rectangular antibody spots of 30 µm diameter on selected areas of the silicon nitride substrate and the process was performed multiple times to produce an array of 100×100 antibody spots using a single laser pulse for each spot. In this example of the present invention, the donor and the receiver substrates were placed on micrometer-precision computer-controlled stages and were synchronized with the laser source.

For the functionalization of the laser transferred antibodies on the silicon nitride substrate, the donor substrate (circular quartz) was removed and a single laser pulse was employed for each antibody spot. The laser source employed for the functionalization was a pulsed Nd:YAG laser source operating at 355 nm with a pulse duration of 8 ns. The laser spot on the receiver substrate was adjusted at 30 µm and each pulse irradiated the entire surface of each antibody spot. The laser fluence was adjusted at 30 mJ/cm$^2$ and each antibody spot received one laser pulse. The process was repeated multiple times to functionalize selected areas of the silicon nitride substrate, where the biological material has been previously transferred onto. The process was monitored using the high power imaging system described above.

Another example of the present invention relates to the laser transfer of active pharmaceutical ingredients, in this case paracetamol (other ingredients may be theophylline, felodipine and hydrochlorothiazide etc) and the subsequent laser encapsulation (functionalization) with a biodegradable polymer (polycaprolactone, PCL, etc) on a substrate suitable for drug delivery applications for example on a biodegradable material.

The donor substrate has been prepared by dissolving a small quantity of paracetamol (10 mg, paracetamol) in water and drop casting 10 µl of the solution on a circular quartz substrate (donor substrate, 25.4 mm diameter, 1 mm thickness) to produce a uniform thin film.

The apparatus employed for the transfer of paracetamol on the receiver substrate included a pulsed Nd:YAG laser source operating at 532 nm with a pulse duration of 8 ns. This laser wavelength was selected since a thin Au coating was applied on the circular quartz substrate as an absorbing layer to absorb the laser energy and induce the propulsion of the material towards the receiver substrate. The laser beam was focused using a microscope objective (15× magnification) on the donor substrate and the laser spot size could be varied between 1-300 µm. The system operated at mask projection conditions and the process could be viewed in real time using a high power imaging system based on the inverted microscope principle with the aid of a CCD camera. The energy density of the laser may be adjusted using a rotating waveplate and a polarizer between 50-200 mJ/cm$^2$. After the transfer of paracetamol on selected areas of the receiver substrate the donor substrate is removed and a second laser beam is used to transfer PCL using the 355 nm (8 ns pulse duration) wavelength on the areas where paracetamol was previously transferred to post process the transferred material on the receiver substrate in order to form the encapsulation matrix.

The laser spot on the receiver substrate can be varied between 1-300 µm and each pulse irradiates the entire surface of each paracetamol spot. The laser fluence may be varied between 30-150 mJ/cm$^2$ and each paracetamol spot received one laser pulse. The process was repeated multiple times to encapsulate selected areas on the receiver substrate, where the paracetamol has been previously transferred onto. The process was monitored using the high power imaging system described above.

The proposed method can be used in the following applications:

Polymer, powder and inorganic material arrays and patterns/structures (lines, pads) that may be used as functional materials in microelectronic applications (transistors, sensors), scaffolds (3D building blocks of biomaterial hosting and proliferation), micro-components and opto-electronic applications.

Chemical substances used in pharmaceutical drugs (Paracetamol C8H9NO2, etc.).

Biomaterial microarrays, protein and antibody assays, etc. with a functionalized pattern diameter down to 1 µm, and hence it can be used to selectively functionalize a large number of different biomaterial microarrays (i.e. up to 1000 different DNA arrays) on the same substrate for i.e. DNA analysis, ELISA tests, patient stratification etc. Moreover, in DNA analysis, since washing and blocking processes are often required it would be useful to apply the same liquids on the same substrate avoiding excessive use of washing and blocking reagents that in biomedical sciences are far too expensive. This also leads to a reduction of the processing time, hence more samples can be analyzed in a shorter time window.

Although only a number of examples have been disclosed herein, other alternatives, modifications, uses and/or equivalents thereof are possible. Furthermore, all possible combinations of the described examples are also covered. Thus, the scope of the present disclosure should not be limited by particular examples, but should be determined only by a fair reading of the claims that follow. If reference signs related to drawings are placed in parentheses in a claim, they are solely for attempting to increase the intelligibility of the claim, and shall not be construed as limiting the scope of the claim.

Further, although the examples described with reference to the drawings comprise computing apparatus/systems and processes performed in computing apparatus/systems, the invention also extends to computer programs, particularly computer programs on or in a carrier, adapted for putting the system into practice.

The invention claimed is:

1. A method of transferring a biological, polymer or monomer material coated on a front surface of donor substrate to a front surface of a receiver substrate, the front surface of the donor substrate facing the front surface of the receiver substrate, the donor substrate comprising a transparent portion and an absorbing layer on a front side of the transparent portion, the method comprising: irradiating with a first laser beam of a laser a portion of a back side of the transparent portion to increase the pressure and/or temperature of the absorbing layer to eject a portion of the biological, polymer or monomer material from the donor substrate and transfer the portion of the biological, polymer or monomer material to the receiver surface; post-processing the portion of the biological, polymer or monomer material transferred on the receiver substrate by irradiating with a second laser beam of a laser a portion of the front side of the receiver surface, wherein in case of transferring polymer or monomer material, the post-processing comprises photopolymerization of the transferred polymer or monomer material; and wherein in case of transferring biological material, the post-processing comprises functionalizing the transferred biological material, wherein a laser energy for the post-processing is at a level that does not induce any damages to the biological, polymer or monomer material, further comprising setting a fluence of the second laser beam at between 30 and 500 mJ/cm$^2$.

2. The method according to claim 1, further comprising: removing the donor substrate after the portion of the biological, polymer or monomer material has been transferred.

3. The method according to claim 1, further comprising setting a fluence of the first laser beam at between 50 and 1500 mJ/cm$^2$.

4. The method according to claim 1, further comprising selecting a wavelength of the first and second laser beams at between 100 nm and 1550 nm.

5. The method according to claim 1, further comprising focusing the first laser beam on the donor surface to select the portion of the biological, polymer or monomer material to eject from the donor substrate.

6. The method according to claim 1, wherein transferring comprises repeating the irradiating of the first substrate to generate a pattern of the biological, polymer or monomer on the receiver substrate.

7. The method according to claim 1, wherein transferring comprises liquid phase transferring by focusing the first laser beam to cause formation of an elongated liquid jet travelling towards the receiver substrate.

8. The method according to claim 1, wherein transferring comprises solid phase transferring by focusing the first laser beam to cause formation of a solid flyer travelling towards the receiver substrate.

9. The method according to claim 1, wherein functionalizing comprises irradiating the portion of the biological material on the receiver surface to cause binding of the portion of the biological material on a selected part of the receiver substrate.

10. The method according to claim 9, wherein binding comprises inducing a covalent bond between a first element of the biological material and a second element of the receiver substrate.

11. The method according to claim 10, comprising inducing a covalent bond between a sulfur element of the biological material and a carbon element of the receiver substrate.

12. The method according to claim 10, comprising inducing a covalent bond between a nitrogen element of the biological material and a carbon element of the receiver substrate.

13. The method according to claim 1, comprising transferring a pharmaceutical material to the receiver substrate, wherein post-processing comprises adding a second layer of biodegradable material to encapsulate said transferred pharmaceutical material.

14. The method according to claim 1, further comprising adjusting the density of the laser using a rotating waveplate and a polarizer.

* * * * *